(12) United States Patent
Terry

(10) Patent No.: US 6,275,621 B1
(45) Date of Patent: Aug. 14, 2001

(54) MOIRE OVERLAY TARGET

(75) Inventor: Roger M. Terry, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/257,519

(22) Filed: Feb. 25, 1999

Related U.S. Application Data

(60) Provisional application No. 60/076,434, filed on Mar. 2, 1998.

(51) Int. Cl.$^7$ .................................................. G06K 9/36
(52) U.S. Cl. ............................................ 382/289; 382/294
(58) Field of Search .................................. 382/289, 293, 382/294; 345/435, 437

(56) References Cited

U.S. PATENT DOCUMENTS

| | | | | |
|---|---|---|---|---|
| 5,613,013 | * | 3/1997 | Schuette | 382/124 |
| 5,694,488 | * | 12/1997 | Hartmann | 382/210 |
| 5,732,163 | * | 3/1998 | Brandstetter et al. | 382/296 |
| 6,075,893 | * | 6/2000 | Brandstetter et al. | 382/199 |

\* cited by examiner

Primary Examiner—Yon J. Couso

(74) *Attorney, Agent, or Firm*—David Denker; Wade James Brady, III; Frederick J. Telecky, Jr.

(57) ABSTRACT

A method and system of measuring misalignment between two levels wherein there is provided a first grating pattern (19, 21, 23, 25, 3, 5, 7, 9) on a first layer (1) and a second grating pattern (19', 21', 23', 25', 3', 5', 7', 9') on a second layer (41) capable of providing Moire fringes when disposed over the first grating pattern and which is disposed over the first grating pattern whereby the first and second grating patterns are capable of providing Moire fringes. Misalignment of the first layer relative to the second layer is measured from the position of the Moire fringe provided by the first and second grating patterns either visually or by optical instrumentation. The second layer is preferably transparent. The first grating pattern comprises a first group of plural sets of lines (3, 5, 7, 9), each of the lines of each of the sets being parallel to each other and extending across first imaginary straight lines, a second group of plural sets of lines (19, 21, 23, 25) each of the lines of each set of lines of the second group being parallel to each other and each extending across a second imaginary straight line, each second imaginary line being parallel to a different one of the first imaginary lines, the second grating pattern being substantially identical to that of the first layer with the imaginary lines overlapping except that overlapping sets of lines are at an angle to each other different from being parallel and preferably overlap at an angle of less than about 60 degrees. Preferably, the first imaginary straight lines numbers four lines in the shape of a rectangle.

16 Claims, 1 Drawing Sheet

MOIRE OVERLAY TARGET

This application claims priority under 35 USC § 119 (e)(1) of provisional application number 60/076,434, filed Mar. 2, 1998.

BACKGROUND OF THE INVENTION

1. Field of the Invention

This invention relates to a method for measuring overlay between two patterned thin films using Moire fringes.

2. Brief Description of the Prior Art

As geometries of components of semiconductor devices continually decrease, fabrication techniques must also continually be altered to accommodate these smaller geometries. Among the fabrication techniques affected by this decrease in geometries is the alignment between layered thin film patterns. Accordingly, the methods used to measure the alignment or overlay between two patterned layers must become more precise and accurate.

The current technique for measuring overlay between two) patterned thin films in the fabrication of semiconductor devices is to measure the displacement between the centers of two different sized patterned boxes or frames, each box or frame created in different layers and sprinted concentrically. One box or frame is typically photoresist and the other box or frame has typically been etched into the substrate. A measurement of the displacement of the centers of the boxes or frames is a measure of how well the patterns in one thin film layer are overlayed with another thin film layer.

Moire patterns are well known in the scientific literature. Moire patterns are produced when the lines of overlapping figures cross at an angle, generally of less than 45 degrees. The Moire lines are then the locus of points of intersection. At crossings of less than 45 degrees a Moire pattern of equispaced lines is observed which are known as Moire fringes. The spacing of the fringes increases with decreasing crossing angle.

Measurement of Moire fringes has been applied to the alignment of a wafer and a reticle in lithographic applications as described by B. P. Singh, T. Goto, et al., "Tracking and dynamic control of the angular alignment position in a photolithographic mask aligner by the moire interference technique", *Review of Scientific Instruments*, 66 (3), 2658, (March, 1995) and in a publication of M. C. King and D. H. Berry, *Applied Optics* 11, page 2455 (1972). The prior art for measuring box or frame type targets is set forth in a paper of M. Davidson, K. Kaufman and I. Mazor entitled "First Results of a Product Utilizing Coherence Probe Imaging for Wafer Inspection", *SPIE Proceedings*, Vol. 921, 1988 which discloses little more than automated microscopes. These types of tools can be modified for detection and measurement of the Moire fringe pattern. Visual inspection can also be performed using microscopes if some type of graduated scale is patterned in addition to the gratings.

SUMMARY OF THE INVENTION

In accordance with the present invention, the boxes or frames of the prior art are replaced by overlapping gratings wherein the box or frame edges are actually Moire fringes created by the grating pattern pairs. Each grating pattern is printed or formed in a different patterned thin film layer with the layers spaced one above the other. Measurements of relative fringe location provide information about the overlay of the two patterned layers and are useful in determining how well layered patterns at different levels are aligned with each other. The displacement of a fringe is related to the grating pattern displacement by:

$$\Delta x \text{ fringe} = \Delta y \text{ grating} * [\cot(\grave{E}_1/2)]$$

$$\Delta y \text{ fringe} = \Delta x \text{ grating} * [\cot(\grave{E}_2/2)]$$

where $\Delta x$ fringe is the displacement of the vertical fringe in the x direction, $\Delta y$ fringe is the displacement of the horizontal fringe in the y direction, $\Delta y$ grating is the displacement of all gratings in the y direction, $\Delta x$ grating is the displacement of all gratings in the x direction and $\grave{E}_y$ is the angle between the overlapping gratings. When $\grave{E}_y$ is less than 90 degrees, fringe movement is greater than or is amplified with respect to the grating pattern movement and the term $[\cot \grave{E}_y/2]$ is the amplification factor. The angles $\grave{E}_1$ and $\grave{E}_2$ are not necessarily equal. Two boxes are shown in each of FIGS. 1 and 2 (boxes composed of lines 11, 13, 15, 17, lines 27, 29, 31, 33, lines 11', 13', 15', 17' and lines 27', 29', 31' 33' through the gratings for illustrative purposes. $\grave{E}_1$ applies to all gratings that intersect vertical box edges and $\grave{E}_2$ applies to all gratings that intersect horizontal box edges. In addition, the entire grating structure can be rotated by some angle and measured with respect to a rotated set of axes x' and y'.

The amplification factor $[\cot \grave{E}_y/2]$ is created by two effects. A $[\cot \grave{E}_y/2]/2$ term comes from Moire amplification. A *2 term comes as a result of the difference in direction of rotation angle between the gratings along one direction of the imaginary large box and the gratings along the same direction of the imaginary small box. The resulting effect is that the displacement direction of the fringe formed by the outer structures due to a change in overlay is rotated by 180 degrees with respect to the displacement direction of the fringe formed by the inner structures. In other words, the inner Moire fringes move in the opposite direction to that of the outer Moire fringes, this resulting in a doubling of the sensitivity.

Overlay can also be measured using only four gratings per layer (L-pattern) wherein there are provided one set of vertical outer structures, one set of vertical inner structures, one set of horizontal outer structures and one set of horizontal inner structures.

A grating structure as used in accordance with the present invention includes, at a first layer, a first group of lines which comprises four sets of lines, each of the lines of each set of lines being parallel to each other and each line of each set of lines extending across a different one of first imaginary straight lines. The first imaginary straight lines are in a first geometrical shape, preferably that of a first rectangle. A second group of four sets of lines enclose the first group, each of the lines of each set of lines of the second group being parallel to each other and each line extending across a second imaginary straight line. The second imaginary straight lines are in the shape of a second geometrical shape similar to the first geometrical shape and preferably in the shape of a second rectangle with the second imaginary straight lines each being parallel to a different one of the first imaginary straight lines. Preferably, each of the lines of each opposing set of lines are parallel to each other and/or, preferably, the lines of non-opposing sets of lines are not parallel to each other. The angle between the imaginary lines and the lines crossing the imaginary lines is generally less than 45 degrees and preferably less than about 30 degrees but greater than zero degrees.

At a second layer, the grating structure is identical to that of the first layer with the imaginary lines overlapping except that overlapping sets of lines are at an angle to each other different from being parallel, generally less than 90 degrees and preferably less than about 60 degrees. Lines on the same layer of the first rectangle and second rectangle crossing parallel imaginary lines preferably make a different angle with their respective imaginary line. None of the lines which provide the Moire fringes are positioned normal or parallel to their respective imaginary line.

With the above described arrangement, starting with the imaginary lines overlapping and with a pair of opposing imaginary lines remaining parallel to each other, when one of the layers is moved relatives to the other layer there will be a moving Moire fringe created by the two patterns on different layers. Conversely, when the imaginary lines are overlapping, the location of the Moire fringe can be observed, either by the human eye or by viewing equipment, and the amount of misalignment between the two layers can be determined by the location of the Moira fringe.

Moire patterns increase the sensitivity to displacements between the structures that serve to create the patterns and therefore can be used to measure displacements with higher accuracy and precision than is available by prior art procedures.

DESCRIPTION OF THE PREFERRED EMBODIMENT

Figure 1:
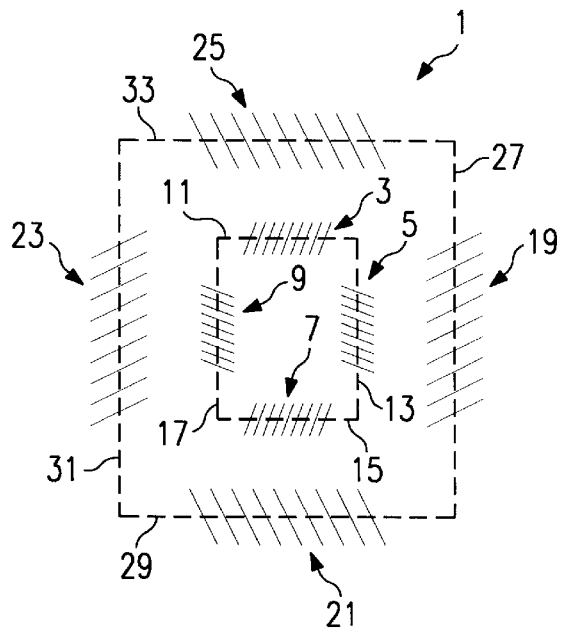
FIG. 1 is a schematic diagram of a first layer, transparent at least in part, having a first grating pattern thereon.
Figure 2:
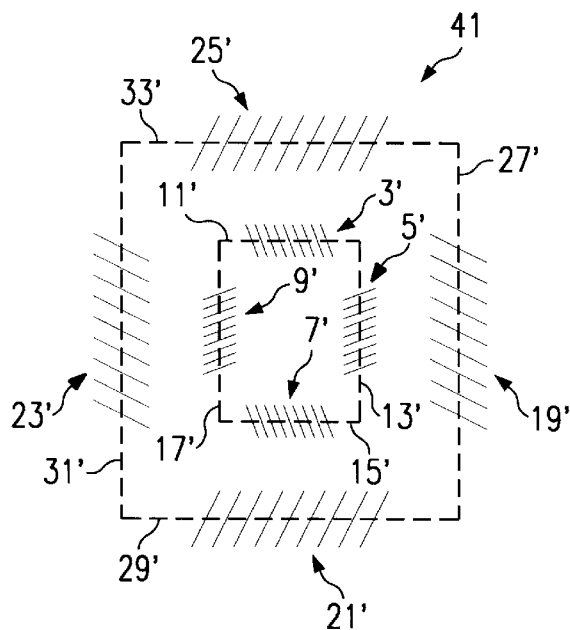
FIG. 2 is a schematic diagram of a second layer having a second grating pattern thereon.

Referring to FIG. 1, there is shown a first grating 1 structure as used in accordance with the present invention and provided on a first level or layer. The grating 1 includes a first group of four sets of lines 3, 5, 7, 9, each of the lines of each set of lines being parallel to each other and each of the lines of each set extending across an associated first imaginary straight line 11, 13, 15, 17. The first imaginary straight lines are in the shape of a first rectangle. A second group of four sets of lines 19, 21, 23, 25 enclose the first group, each of the lines of each set of lines of the second group being parallel to each other and each extending across an associated second imaginary straight line 27, 29, 31, 33. The second imaginary straight lines are in the shape of a second rectangle with the second imaginary straight lines each being parallel to a different one of the first imaginary straight lines. Preferably, each of the lines of each opposing set of lines are parallel to each other and/or, preferably, the lines of non-opposing sets of lines are not parallel to each other. At a second layer 41, as shown in FIG. 2 wherein all structures similar to the structures of FIG. 1 as explained hereinbelow are provided with the same character references with a prime ('), the grating structure is identical to that of the first layer with the imaginary lines overlapping except that overlapping sets of lines are at an angle to each other different from being parallel. Lines on the same layer of the first rectangle and second rectangle crossing parallel imaginary lines preferably make a different angle with their respective imaginary line. None of the lines which provide the Moire fringes are positioned normal to their respective imaginary line. In this way, starting with the imaginary lines overlapping and with a pair of opposing imaginary lines remaining parallel to each other, when one of the layers is moved relative to the other layer there will be a moving Moire fringe created by the two patterns on different layers.

Figure 3:
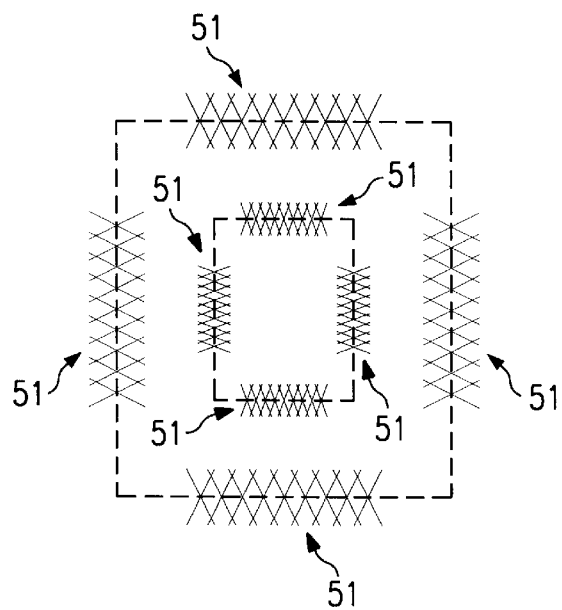
FIG. 3 is a schematic diagram showing the first and second layer disposed one over the other.

In operation, as shown in FIG. 3, the layers 1 and 41 are placed one atop the other, one of the layers preferably being a semiconductor substrate or other layer provided during semiconductor fabrication with the grating pattern of FIG. 1, for example, on a surface thereof. A second layer, preferably transparent, with a second grating pattern thereon, such as, for example, the pattern of FIG. 2 is formed on the second layer With the patterns of FIGS. 1 and 2 overlapping each other as shown in FIG. 3, Moire fringes 51 are formed at all locations wherein a line from layer 1 crosses a line from layer 41, this providing a straight line of Moire fringes 51 formed by the intersections of the patterns on the two layers 1 and 51. The location of the Moire fringes 51 is then observed, either optically with automatic equipment or visually by a human operator with a determination of the degree of alignment being made from the observation.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of measuring misalignment which comprises the steps of:
   (a) providing a first grating pattern on a first layer, wherein said first grating pattern comprises a first group of plural sets of lines, each of said lines of each of said sets being parallel to each other and extending across first imaginary straight lines, a second group of plural sets of lines, each of the lines of each set of lines of the second group being parallel to each other and each extending across a second imaginary straight line, each said second imaginary line being parallel to a different one of said first imaginary lines;
   (b) providing a second grating pattern on a second layer capable of providing Moire fringes when disposed over said first grating pattern; said second grating pattern being substantially identical to that of the first layer with the imaginary lines overlapping except that overlapping sets of lines are at an angle to each other different from being parallel;
   (c) placing said second grating pattern over said first grating pattern whereby said first and second grating patterns are capable of providing Moire fringes; and
   (d) measuring misalignment of said first layer relative to said second layer from the position of the Moire fringe provided by said first and second grating patterns.

2. The method of claim 1 wherein said second layer is transparent.

3. The method of claim 1 wherein said first imaginary straight lines numbers four lines in the shape of a rectangle.

4. The method of claim 2 wherein said first imaginary straight lines numbers four lines in the shape of a rectangle.

5. The method of claim 1 where the angle between overlapping parallel lines of said first grating pattern and said second grating pattern is less than 30 degrees.

6. The method of claim 2 where the angle between overlapping parallel lines of said first grating pattern and said second grating pattern is less than 90 degrees.

7. The method of claim 3 where the angle between overlapping parallel lines of said first grating pattern and said second grating pattern is less than 90 degrees.

8. The method of claim 4 where the angle between overlapping parallel lines of said first grating pattern and said second grating pattern is less than 90 degrees.

9. A system for measuring misalignment which comprises:
   (a) a first grating pattern on a first layer, wherein said first grating pattern comprises a first group of plural sets of lines, each of said lines of each of said sets being parallel to each other and extending across first imaginary straight lines, a second group of plural sets of lines, each of the lines of each set of lines of the second group being parallel to each other and each extending across a second imaginary straight line, each said second imaginary line being parallel to a different one of said first imaginary lines;
   (b) a second grating pattern on a second layer capable of providing Moire fringes when disposed over said first grating pattern and disposed over said first grating pattern, said second grating pattern being substantially identical to that of the first layer with the imaginary lines overlapping except that overlapping sets of lines are at an angle to each other different from being parallel; and
   (c) means for measuring misalignment of said first layer relative to said second layer from the position of the Moire fringe provided by said first and second grating patterns.

10. The system of claim 9 wherein said second layer is transparent.

11. The system of claim 9 wherein said first imaginary straight lines numbers four lines in the shape of a rectangle.

12. The system of claim 10 wherein said first imaginary straight lines numbers four lines in the shape of a rectangle.

13. The system of claim 9 where the angle between overlapping parallel lines of said first grating pattern and said second grating pattern is less than 90 degrees.

14. The system of claim 10 where the angle between overlapping parallel lines of said first grating pattern and said second grating pattern is less than 90 degrees.

15. The system of claim 11 where the angle between overlapping parallel lines of said first grating pattern and said second grating pattern is less than 90 degrees.

16. The system of claim 12 where the angle between overlapping parallel lines of said first grating pattern and said second grating pattern is less than 90 degrees.

* * * * *